United States Patent [19]
Imai et al.

[11] Patent Number: 5,473,166
[45] Date of Patent: Dec. 5, 1995

[54] INCLINATION DETECTING APPARATUS HAVING AN INTENSITY ADJUSTING UNIT

[75] Inventors: Yuji Imai, Ohmiya; Shinji Wakamoto, Tokyo, both of Japan

[73] Assignee: Nikon Corporation, Tokyo, Japan

[21] Appl. No.: 330,826

[22] Filed: Oct. 27, 1994

[30]     Foreign Application Priority Data

Oct. 29, 1993 [JP] Japan .................................. 5-271498

[51] Int. Cl.$^6$ ............................................... G01N 21/86
[52] U.S. Cl. ........................................ 250/548; 356/401
[58] Field of Search .............................. 250/548, 561, 250/205, 574, 204; 356/401, 400, 399, 375; 355/53, 55

[56]     References Cited

U.S. PATENT DOCUMENTS

| | | | |
|---|---|---|---|
| 4,558,949 | 12/1985 | Uehara et al. ................... | 356/152 |
| 4,902,900 | 2/1990 | Kamiya et al. ................... | 250/548 |
| 5,015,866 | 5/1991 | Hayashi ........................... | 250/548 |

*Primary Examiner*—Edward P. Westin
*Assistant Examiner*—Que T. Le
*Attorney, Agent, or Firm*—Shapiro and Shapiro

[57]     ABSTRACT

An inclination detecting device has a light emitting system for emitting a parallel light flux to a substrate; a light receiving system for condensing the light reflected from the substrate, detecting the reflected light photoelectrically and outputting a photoelectric signal in accordance with the intensity of the reflected light; a stop member for changing at least one of the shape and the size of an illumination area of the parallel light flux on the substrate; an adjusting unit for changing the intensity of the photoelectric signal in accordance with the change of at least one of the shape and the size of the illumination area defined by the stop member; and a unit for detecting an inclination of the substrate with respect to a predetermined reference plane based on the photoelectric signal from the light receiving system.

16 Claims, 3 Drawing Sheets

INCLINATION DETECTING APPARATUS HAVING AN INTENSITY ADJUSTING UNIT

BACKGROUND OF THE INVENTION

1. Field of the Invention

The present invention relates to a device for detecting the inclination of a substrate with respect to a predetermined reference plane and more particularly to an automatic leveling device in an exposure apparatus for manufacturing semiconductor devices.

2. Related Background Art

In a reduction projection type exposure apparatus for manufacturing integrated circuits, an object lens having a great numerical aperture (N.A.) is generally used. The depth of focus of the object lens is very small. Therefore, in order to expose the pattern of a mask over an entire exposure region on a wafer clearly, the exposure region on the wafer is required to coincide with an image surface of the object lens. Accordingly, the exposure apparatus is provided with a device for detecting the inclination (horizontal position) of the exposure region on the wafer with respect to a plane perpendicular to the optical axis of the object lens.

Such a device is disclosed in U.S. Pat. No. 4,558,949. The device has an irradiating optical system for emitting a parallel light flux to the substantially whole exposure area (shot area) on the wafer and a condensing optical system for condensing the light flux reflected by the wafer surface on a light receiving element by means of a condensing lens. Upon receiving the reflected light, the light receiving element outputs a detection signal corresponding to its light received position. Based on the detection signal, the horizontal position of the shot area on the wafer is detected.

Also, there is a case that a plurality of IC devices (hereinafter referred to as "chips") are formed in a shot area. Now, a partially broken or incomplete shot area located in a peripheral portion of a wafer is considered. If there are one or more complete chips in the broken shot area, the pattern of a reticle can be exposed repeatedly one over another even on the broken shot area. A device for detecting the horizontal position of such a broken shot area is disclosed in U.S. Pat. No. 4,902,900.

The device is provided with a turret plate having a plurality of field stops whose shapes and dimensions are different from each other in an irradiating optical system for emitting a parallel light flux to a detection area (shot area) on a wafer. Then, a desirable field stop is selected in accordance with the position of a shot area on a wafer and a parallel light flux is emitted to the entire surface of a portion of the shot area wherein there are not broken chips.

However, in the above prior art, when the material of the wafer, the kind of base (metallic film, insulating film, etc.) applied on the wafer, the kind of photoresist applied on the base, etc. are changed to cause the reflectance of the light (the reflectance of the wafer) to be changed, the intensity (quantity) of the reflected light incident on a photoelectric detector is changed. Also, when light having comparatively high coherence is utilized as the light source, the light reflected by the surface of the photoresist and the light reflected by the base are liable to interfere with each other. Accordingly, even though the thickness of the photoresist is changed slightly, the intensity of the reflected light incident on the photoelectric detector is changed largely. Further, the intensity of the reflected light incident on the photoelectric detector is changed due to the structure of the circuit pattern formed on the shot area, too. Furthermore, the intensity of the reflected light entering the photoelectric detector is changed due to changes of shape and size of the illumination area of the parallel light flux.

Thus, when the reflectance of the wafer, the structure of the circuit pattern on the shot area, the shape and size of the illumination area (these are called "reflective characteristics" hereinafter) are changed and the intensity of the light flux incident on the photoelectric detector is lowered, the S/N ratio of a photoelectric signal output from the photoelectric detector is lowered, causing an error in the detection result of the horizontal position.

SUMMARY OF THE INVENTION

It is therefore an object of the present invention to provide a horizontal position detecting device capable of detecting the inclination of a substrate with respect to a predetermined reference plane constantly accurately even though the intensity (level) of a photoelectric signal output from a photoelectric detector is changed due to a change of reflective characteristics of each shot area.

In order to achieve the above object, an inclination detecting device of the present invention includes, e.g., as shown in FIG. 1, a light emitting system (10) for emitting a parallel light flux to a substrate (3); a light receiving system (20) for condensing the light reflected from the substrate (3), detecting the reflected light photoelectrically and outputting a photoelectric signal in accordance with the intensity of the reflected light; a stop member (16) for changing at least one of the shape and the size of an illumination area of the parallel light flux on the substrate (3); an adjusting unit (31, 35) for changing the intensity of the photoelectric signal in accordance with the change of at least one of the shape and the size of the illumination area defined by the stop member; and a unit for detecting an inclination of the substrate (3) with respect to a predetermined reference plane (19) based on the photoelectric signal from the light receiving system (20).

Also, another inclination detecting device of the present invention includes, e.g., as shown in FIG. 1, a light emitting system (10) for emitting a parallel light flux to a predetermined detection area on a substrate (3);

a light receiving system (20) for condensing the light reflected from the substrate (3), detecting the reflected light photoelectrically and outputting a photoelectric signal in accordance with the intensity of the reflected light;

an adjusting unit (31, 35) for changing the intensity of the photoelectric signal in accordance with a change in reflective characteristics of the light flux in the detection area; and a unit for detecting an inclination of the substrate (3) with respect to a predetermined reference plane (19) based on the photoelectric signal from the light receiving system (20).

Further, an inclination detecting method of the present invention includes the first step of emitting a parallel light flux to a substrate (3) and obtaining, by condensing the light reflected from the substrate (3) and detecting the reflected light photoelectrically, a photoelectric signal in accordance with the intensity of the reflected light; the second step of changing the intensity of said photoelectric signal in accordance with at least one of the shape and the size of an illumination area of the parallel light flux on the substrate (3) or a change of reflective characteristics of the substrate (3); and the third step of detecting an inclination of the substrate (3) with respect to a predetermined reference plane (19) based on the photoelectric signal changed in the second step.

According to the present invention, even though reflective characteristics of a shot area (a detection area) on the substrate (3) is changed, or at least one of the shape and the size of the illumination area of the light flux on the shot area is changed, the adjusting unit (31, 35) adjusts the intensity of a photoelectric signal from the photoelectric detector (22) so as to fall within a predetermined allowable range. Therefore, it is possible to detect the inclination of the substrate (3) with respect to the predetermined reference plane with precision.

DESCRIPTION OF THE PREFERRED EMBODIMENTS

An embodiment of the present invention will be described with reference to FIG. 1.

Figure 1:
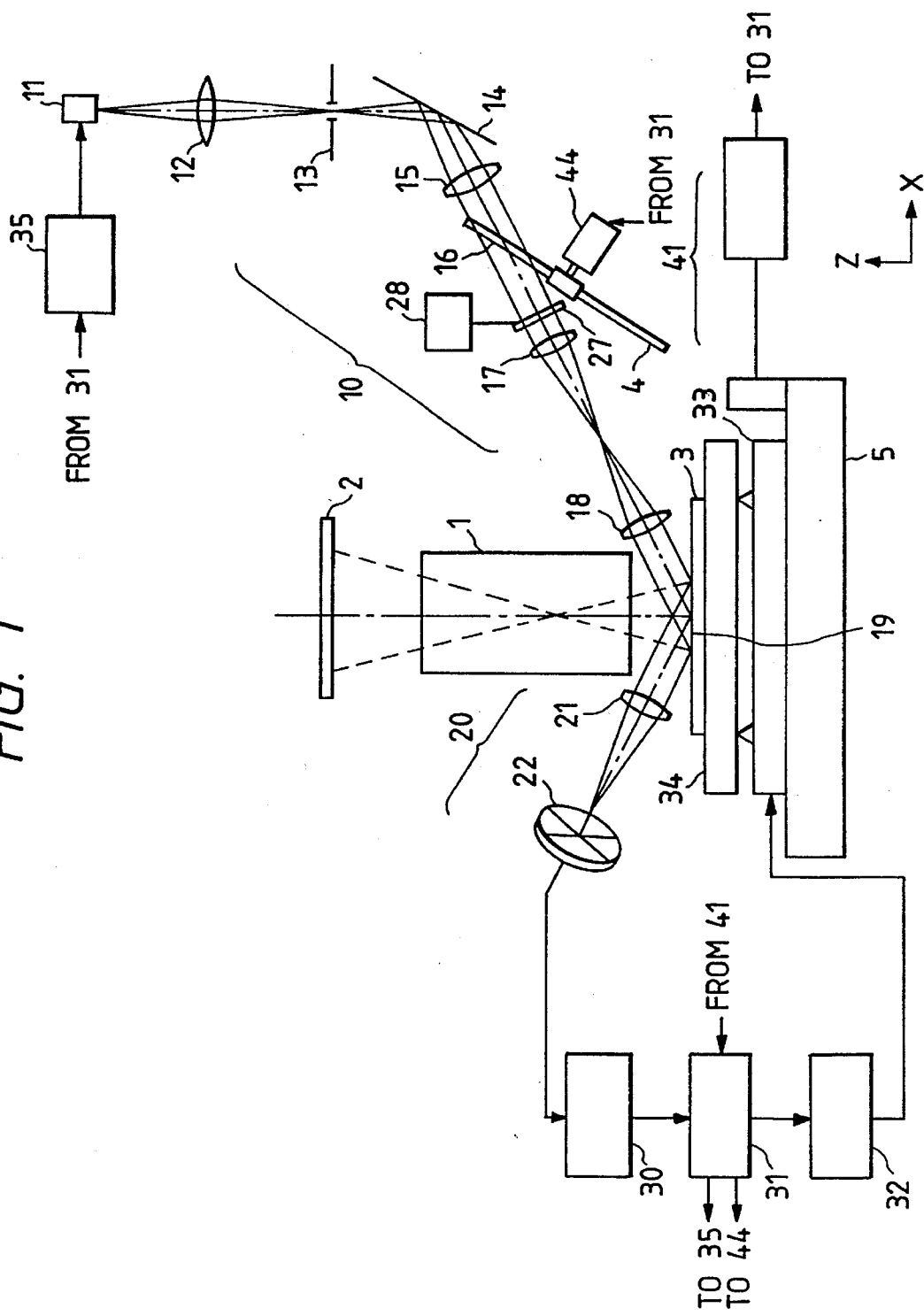
FIG. 1 schematically shows the structure of a horizontal position detecting device according to an embodiment of the present invention.

FIG. 1 schematically shows the structure of a horizontal position detecting device according to the embodiment of the present invention, A reticle 2 and a wafer 3 are positioned at conjugate positions with respect to a projection optical system 1. The pattern on the reticle 2 is illuminated by an illumination optical system (not shown) and projected onto the wafer 3 in reduced size. The wafer 3 is supported by a holder 34, which is disposed on a tilting stage 33. The tilting stage 33 can adjust the inclination of the holder 34 and the wafer 3. The wafer 3, the holder 34 and the tilting stage 33 are disposed on a stage 5 movable in a plane (XY plane) perpendicular to the optical axis of the projection optical system 1. An interference system 41 measures the X-coordinate position of the stage 5. The Y-coordinate position of the stage 5 is also measured by the same interference system and the respective coordinate positions are sent to a main control system 31. In the main control system 31, data such as the diameter of the wafer 3, the arrangement map of shot areas, etc. are stored in advance.

Next, the structure of the horizontal position detecting device for detecting the horizontal position of the wafer surface will be described. This device has an irradiating optical system 10 and a condensing optical system 20. Its fundamental structure is the same as that disclosed in U.S. Pat. No. 4,902,900 and then its detailed description is omitted.

The irradiating optical system 10 has a light source (e.g., a light-emitting diode) 11, a condenser lens 12, a field stop 13 with a minute opening, a mirror 14, a first relay lens 15, a field stop 16 for limiting a detection range (the illumination area of a light flux emitted to the wafer), a filter 27, a second relay lens 17 and an object lens 18.

Light from the light source 11 illuminates the stop 13 via the condenser lens 12. The light passed through the opening of the stop 13 is reflected by the mirror 14 to be incident on the first relay lens 15. The light is made to be a parallel light flux by the first relay lens 15.and supplied to the field stop 16. The field stop 16 is formed of a turret plate 4 provided with 16 stop members (A1 to A16) which have different shapes and dimensions and whose openings are different in size. The light passed through the field stop 16 illuminates the wafer 3 via the filter 27, the second relay lens 17 and the object lens 18 as the parallel light flux. The field stop 16 is positioned at a position conjugate to an image surface 19 with respect to the second relay lens 17 and the object lens 18. Also, drive means 44 rotates the turret plate 4 with the center thereof as the axis of rotation. The filter 27 is, e.g., an electrochromic device (ECD) disposed in a matrix manner. A control unit 28 controls the voltage applied to the electrochromic device in accordance with a signal from the main control system 31 to adjust the transmittance of the light.

The condensing optical system 20 consists of an object lens 21 and a photoelectric detector 22. The optical axis of the irradiating optical system 10 and the optical axis of the condensing optical system 20 are symmetrical with respect to the optical axis of the projection optical system 1. The photoelectric detector 22 is disposed such that the light flux from the illumination optical system 10 is condensed on the center of the photoelectric detector 22 when the image surface 19 coincides with the upper surface of the wafer 3.

Figure 2:
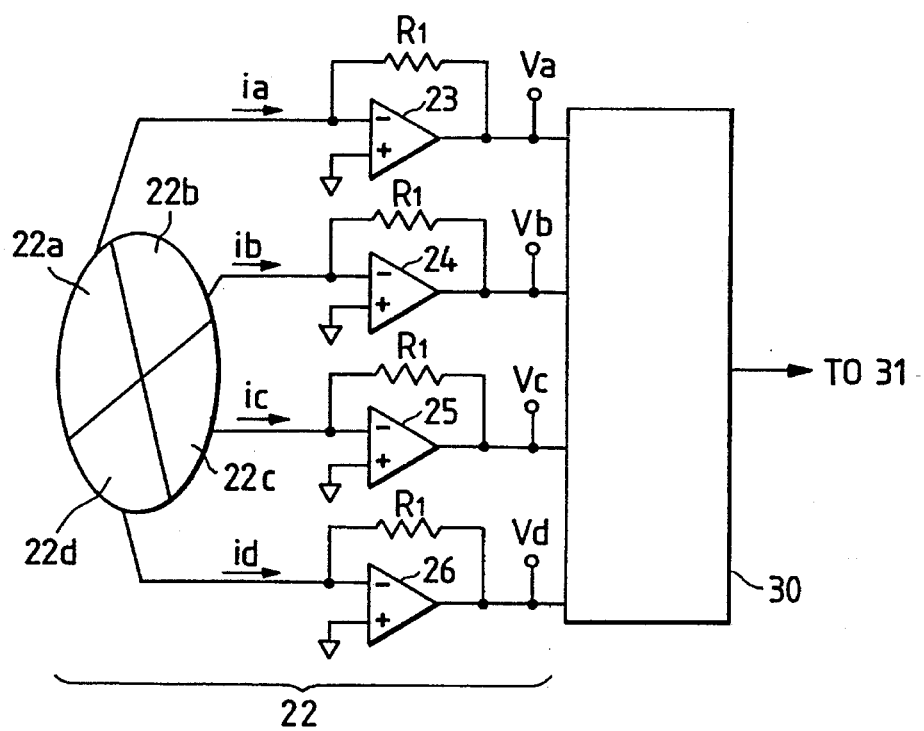
FIG. 2 shows the circuit for explaining photoelectric signals output from the photoelectric detector 22.

Also, as shown in FIG. 2, the light receiving surface of the photoelectric detector 22 has four light receiving areas (e.g., photodiodes) 22a, 22b, 22c and 22d. Upon receiving the reflected light from the wafer 3, the four light receiving areas generate currents in accordance with the intensities (quantities) of the reflected light. These currents are ia, ib, ic and id respectively. These currents are converted into four photoelectric signals in accordance with the respective currents by respective operational amplifiers 23 to 26 and output to a signal processing unit 30. The voltages of these photoelectric signals are Va, Vb, Vc and Vd. Based on these photoelectric signals, the signal processing unit 30 outputs the sum (Va+Vb+Vc+Vd) of the voltages and a detection signal corresponding to the received position of the reflected light (the center of gravity of the light quantity distribution of the reflected light) on the light receiving surface of the photoelectric detector 22 to the main control system 31. The main control system 31 outputs an instruction signal to a light source control unit 35 based on the sum of the voltages. Further, based on the detection signal from the signal processing unit 30, the main control system 31 outputs an instruction signal to a drive unit 32. Upon receiving the instruction signal from the main control system 31, the light source control unit 35 adjusts the value of the current applied to the light source 11 to control the light intensity. Also, upon receiving the instruction signal from the main control system 31, the drive unit 32 drives the tilting stage 33 to adjust the inclination of the wafer 3. The main control system 31 controls the apparatus wholly other than the drive unit 32 and the light source control unit 35.

Figure 4:
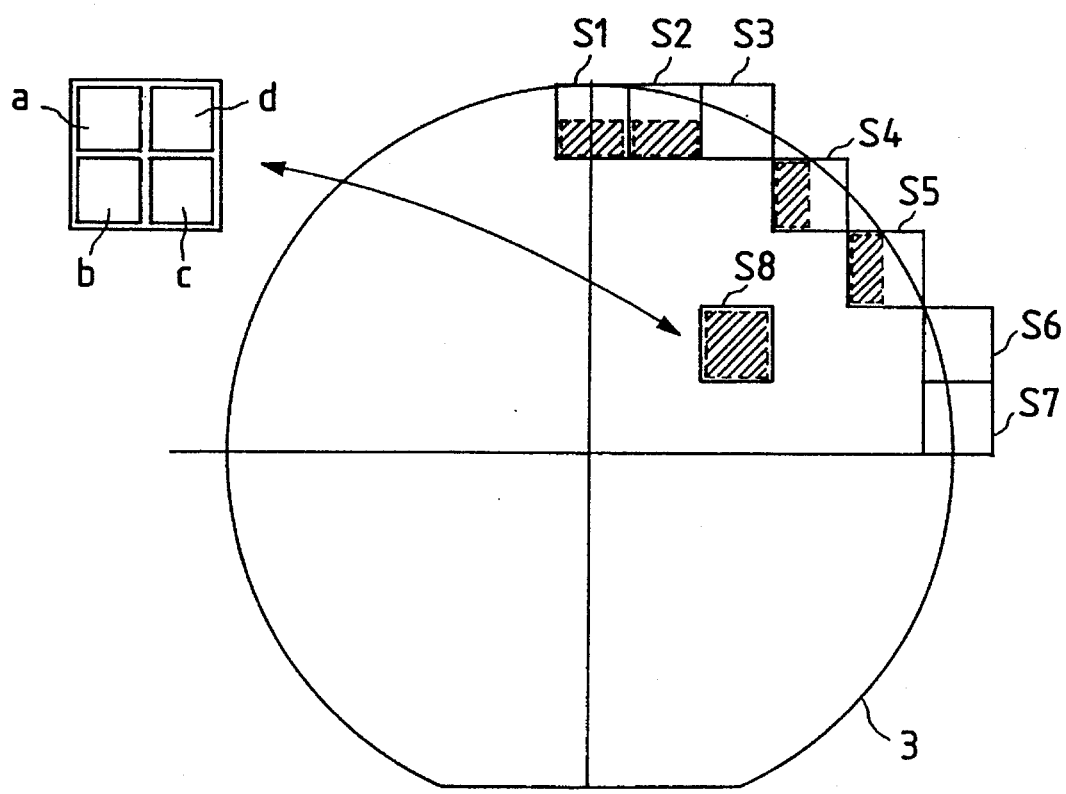
FIG. 4 shows the arrangement of the shot areas on the wafer.

Next, the operations of switching the stop members of the field stop 16 and detecting the horizontal position of the wafer 3 will be described. FIG. 4 shows an example of the arrangement of shot areas on the wafer 3. Four chips a, b, c, d are to be formed in each shot area (S1 to S8).

Figure 3:
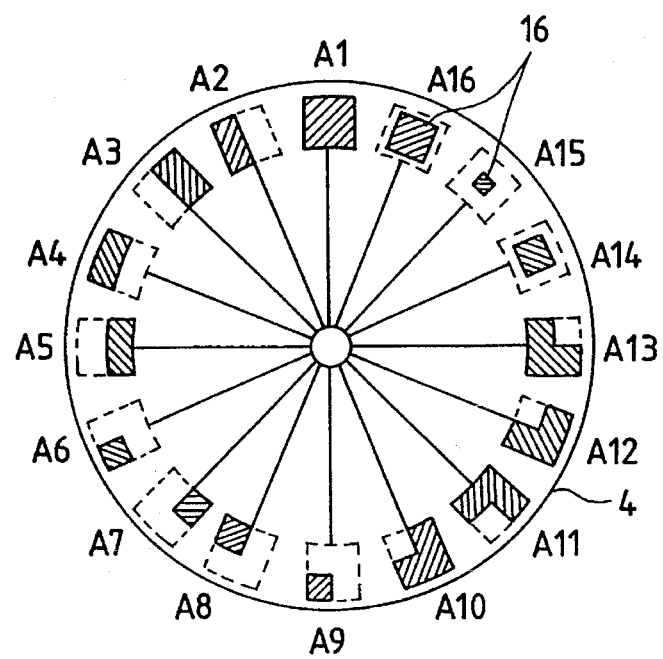
FIG. 3 shows the field stop 16.

When in a peripheral portion of the wafer 3, there is a not broken or complete shot area S8 to be detected for its horizontal position, the main control system 31 makes the light source 11 emit a light flux to the whole shot area S8. Specifically, when a shot area to be detected is, e.g., S8, the main control system 31 drives the drive means 44 to dispose the stop member A1 as shown in FIG. 3 in the light path of the irradiating optical system 10.

Upon receiving the reflected light from the wafer 3, the photoelectric detector 22 outputs photoelectric signals (voltages) Va, Vb, Vc, Vd to the signal processing unit 30. The signal processing unit 30 outputs the sum of the voltages (Va+Vb+Vc+Vd) (hereinafter called "the level of the photoelectric signals") and a detection signal corresponding to the received position of the reflected light on the photoelectric detector 22 to the main control system 31. The level (Va+Vb+Vc+Vd) of the photoelectric signals is the value corresponding to the intensity of the reflected light.

After the level (Va+Vb+Vc+Vd) of the photoelectric signals is input to the main control system 31, the main control system 31 controls the light intensity of the light source 11 via the light source control unit 35 such that the level falls within a preset allowable range. The upper and lower limits of the level of the photoelectric signals between which no error occurs when detecting the horizontal position of the wafer 3 are predetermined, and its range is stored in a memory as the allowable range.

When the level of the photoelectric signals is less than the lower limit of the allowable range, the main control system 31 outputs an instruction signal to the light source control unit 35 to raise the light intensity of the light source 11 thereby to make the level of the photoelectric signals fall within the allowable range. Similarly, when the level of the photoelectric signals is more than the upper limit of the allowable range, the main control system 31 lower the light intensity of the light source 11 via the light source control unit 35. When the level of the photoelectric signal falls within the allowable range, the main control system 31 judges that there would occur almost no calculation error in detecting the horizontal position of the wafer. Then, the light intensity of the light source 11 at that time is maintained. Then, on the basis of a detection signal from the signal processing unit 30 at this time, the horizontal position of the shot area S8 is detected. Thereafter, the main control system 31 drives the tilting state 33 via the drive unit 32 such that the reflected light is incident on the center position of the photoelectric detector 22, i.e., the shot area S8 coincides with the image surface 19.

When the level of the photoelectric signals is within the allowable range, the horizontal position of the shot area S8 is detected directly based on the detection signal from the signal processing unit 30, and the shot area S8 is made to coincide with the image surface 19.

Next, the case that a shot area to be detected is located in a peripheral portion of the wafer 3 and the shot area is partially broken or incomplete will be discussed. For example, when the shot area is S1 or S2 in FIG. 4, completely formed chips are only b and c. Therefore, the main control system 31 makes the light source 11 emit a light flux to a portion where the complete chips are formed. Specifically, the main control system 31 drives the drive means 44 to dispose the stop member A5 as shown in FIG. 3 in the light path of the irradiating optical system 10.

At this time, the intensity of the light flux incident on the photoelectric detector 22 becomes about half of that when the field stop (stop member A1) of a reference size is selected. Therefore, the level of the photoelectric signals output from the photoelectric detector 22 is highly likely to be deviated from the allowable range. However, the main control system 31 controls the light intensity of the light source 11 via the light source control unit 35 such that the level of the photoelectric signals falls within the allowable range, similarly to the above operation. Then, when the level of the photoelectric signals falls within the allowable range, the light intensity of the light source 11 at that time is maintained, and the shot area S1 or S2 is made to coincide with the image surface 19 based on a detection signal from the signal processing unit 30.

Similarly, when a shot area to be detected is S4 or S5, completely formed chips are a and b only. Therefore, the main control system 31 disposes the stop member A2 as shown in FIG. 3 in the light path of the irradiating optical system 10 in order to illuminate the portion of the chips a, b with a light flux from the light source 11. The later operation is the same as that described above.

When a shot area is S3, S6 or S7, all the chips a, b, c, d are broken ships, so the main control system 31 omits the horizontal position detecting operation thereof.

If the reflectance of the wafer 3 is identical over its entire surface, it is not necessary to control the light intensity of the light source 11 for each shot area, and for each shot area having the same number of complete chips, the light intensity of the light source 11 is set to be the same value as the initially set light intensity. Also, in a plurality of wafers in a lot, the light intensity of the light source 11 corresponding to each shot area of the first wafer is stored correspondingly in a memory, and the horizontal positions of the respective shot areas of the second and later wafers may be detected with the respective stored light intensities in the memory.

According to the above structure and operation, even though the reflective characteristics (the reflectance of the wafer, the dimensions of the illumination area) of the plurality of respective shot areas on the wafer vary, the level of the photoelectric signals corresponding to the intensity (quantity) of the reflected light incident on the photoelectric detector is kept constant within the predetermined allowable range, so that almost no detection error occurs.

In this embodiment, the main control system 31 adjusts the light intensity of the light source 11 based on the level of the photoelectric signals from the photoelectric detector 22. However, if the reflective characteristics (reflectance) of each shot area on the wafer are measured in advance, the light intensity of the light source 11 can be adjusted in accordance with the dimensions of the illumination area.

Also, although the light intensity of the light source 11 is adjusted in order to adjust the intensity of the light flux incident on the photoelectric detector 22 in the above embodiment, the transmittance of the filter 27 in FIG. 1 may be adjusted. The filter 27 may be, e.g., a liquid crystal display device. Also, by providing a device capable of replaceably disposing one of a plurality of ND filters with different transmittances in the light path of the irradiating optical system, the main control system 31 may select the ND filter with the desired transmittance to change the quantity of transmitted light. Further, instead of the mirror 14 in FIG. 1, by providing a device capable of replaceably disposing one of a plurality of mirrors with different reflectances in the light path of the irradiating optical system, the main control system 31 may select the mirror with the desired reflectance to change the quantity of reflected light.

Further, the intensity of the light flux incident on the photoelectric detector 22 is adjusted in the above embodiment, and the intensities of the photoelectric signals from the photoelectric detector 22 may be directly adjusted. That is, the main control system 31 may change gains of the operational amplifiers 23 to 26 of the photoelectric detector 22.

As shown in FIG. 2, the currents output from the photoelectric detector 22 are supplied to the signal processing unit 31 as the voltages Va, Vb, Vc, Vd by the operational amplifiers 23 to 26. At this time, the respective gains are determined by resistances $R_1$ connected to the respective amplifiers. By making these resistances as variable resistances and controlling values of the variable resistances by means of the main control system 31, it is possible to make the level (Va+Vb+Vc+Vd) of the photoelectric signals fall within the predetermined allowable range. Also, instead of making the four resistances as the variable resistances, desirable resistances may be selected from a plurality of resistances by switches. Further, the adjustment of the gains of the operational amplifiers and the adjustment of the light intensity of the light source 11 may be combined together. Thus, the present invention is not limited to the above embodiment, various structures can be taken without departing from the scope of the present invention set forth in the accompanying claims.

What is claimed is:

1. An inclination detecting device comprising:

a light emitting system for emitting a parallel light flux to a substrate;

a light receiving system for condensing the light reflected from said substrate, detecting the reflected light photoelectrically and outputting a photoelectric signal in accordance with the intensity of the reflected light;

a stop member for changing at least one of the shape and the size of an illumination area of said parallel light flux on said substrate;

an adjusting unit for changing the intensity of said photoelectric signal in accordance with the change of at least one of the shape and the size of said illumination area defined by said stop member; and a unit for detecting an inclination of said substrate with respect to a predetermined reference plane based on said photoelectric signal from said light receiving system.

2. A device according to claim 1, wherein said light emitting system comprises a light source and said adjusting unit comprises a member for adjusting the light intensity of said light source.

3. A device according to claim 1, wherein said adjusting unit comprises an optical member disposed on at least one of light paths of said light emitting system and said light receiving system so as to adjust the transmittance or the reflectance of the light flux emitted to said substrate or the reflected light from said substrate.

4. A device according to claim 1, wherein said light receiving system comprises an amplifier and outputs said photoelectric signal via said amplifier, and said adjusting unit comprises a member for adjusting a gain of said amplifier.

5. A device according to claim 1, wherein said inclination detecting device is incorporated in a projection apparatus for projecting an image of a pattern onto said substrate and detects the inclination of said substrate with respect to an image surface of a projection optical system of said projection apparatus for projecting said image of said pattern onto said substrate.

6. A device according to claim 5, wherein said projection apparatus is an apparatus for exposing said pattern formed on a mask on said substrate and said light emitting system emits said parallel light flux to said substrate in a direction inclined with respect to an optical axis of said projection optical system.

7. An inclination detecting device comprising:

a light emitting system for emitting a parallel light flux to a predetermined detection area on a substrate;

a light receiving system for condensing the light reflected from said substrate, detecting the reflected light photoelectrically and outputting a photoelectric signal in accordance with the intensity of the reflected light;

an adjusting unit for changing the intensity of said photoelectric signal in accordance with a change in reflective characteristics of the light flux in said detection area; and a unit for detecting an inclination of said substrate with respect to a predetermined reference plane based on said photoelectric signal from said light receiving system.

8. A device according to claim 7, wherein said light emitting system comprises a light source and said adjusting unit comprises a member for adjusting the light intensity of said light source.

9. A device according to claim 7, wherein said adjusting unit comprises an optical member disposed on at least one of light paths of said light emitting system and said light receiving system so as to adjust the transmittance or the reflectance of the light flux emitted to said substrate or the reflected light from said substrate.

10. A device according to claim 7, wherein said light receiving system comprises an amplifier and outputs said photoelectric signal via said amplifier, and said adjusting unit comprises a member for adjusting a gain of said amplifier.

11. A device according to claim 7, wherein said inclination detecting device is incorporated in a projection apparatus for projecting an image of a pattern onto said substrate and detects the inclination of said substrate with respect to an image surface of a projection optical system of said projection apparatus for projecting said image on said pattern onto said substrate.

12. A device according to claim 11, wherein said projection apparatus is an apparatus for exposing said pattern formed on a mask onto said substrate and said light emitting system emits said parallel light flux to said substrate in a direction inclined with respect to an optical axis of said projection optical system.

13. An inclination detecting method comprising:

the first step of emitting a parallel light flux to a substrate and obtaining, by condensing the light reflected from said substrate and detecting the reflected light photoelectrically, a photoelectric signal in accordance with the intensity of the reflected light;

the second step of changing the intensity of said photoelectric signal in accordance with at least one of the shape and the size of an illumination area of said parallel light flux on said substrate or variation in reflective characteristics on said substrate; and the third step of detecting an inclination of said substrate with respect to a predetermined reference plane based on said photoelectric signal changed in the second step.

14. A method according to claim 13, wherein in the second step, the intensity of said photoelectric signal is changed by adjusting at least one of intensities of the light flux emitted to said substrate and the reflected light from said substrate.

15. A method according to claim 14, wherein in the second step, the intensity of said photoelectric signal is changed by adjusting the light intensity of a light source of said parallel light flux.

16. A method according to claim 13, wherein in the first step, said photoelectric signal is output via an amplifier and in the second step, the intensity of said photoelectric signal is changed by adjusting a gain of said amplifier.

* * * * *